United States Patent
Usami

(10) Patent No.: US 6,660,557 B2
(45) Date of Patent: Dec. 9, 2003

(54) METHOD OF MANUFACTURING AN ELECTRONIC DEVICE

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/818,638

(22) Filed: Mar. 28, 2001

(65) Prior Publication Data

US 2002/0016020 A1 Feb. 7, 2002

(30) Foreign Application Priority Data

Mar. 28, 2000 (JP) ........................................ 2000-092950

(51) Int. Cl.[7] ........................ H01L 21/44; H01L 21/48; H01L 21/50
(52) U.S. Cl. ........................................................ 438/106
(58) Field of Search .......................................... 438/106

(56) References Cited

U.S. PATENT DOCUMENTS

| | | | | |
|---|---|---|---|---|
| 5,778,529 A | * | 7/1998 | Beilin et al. ................... | 29/852 |
| 5,851,854 A | * | 12/1998 | Haghiri-Tehrani et al. .. | 438/118 |
| 6,080,606 A | * | 6/2000 | Gleskova et al. ............ | 438/151 |
| 6,110,806 A | * | 8/2000 | Pogge ......................... | 438/458 |
| 6,147,662 A | * | 11/2000 | Grabau et al. .............. | 343/895 |
| 6,168,084 B1 | * | 1/2001 | Mish ........................... | 235/492 |
| 6,294,822 B1 | * | 9/2001 | Nakata ........................ | 257/461 |
| 6,297,075 B1 | * | 10/2001 | Odajima et al. ............. | 438/110 |
| 6,303,471 B1 | * | 10/2001 | Unno et al. .................. | 438/464 |
| 6,335,271 B1 | * | 1/2002 | Fukuyama ................... | 438/616 |
| 6,357,664 B1 | * | 3/2002 | Zercher ....................... | 235/488 |
| 6,365,433 B1 | * | 4/2002 | Hyoudo et al. ............. | 438/106 |
| 6,378,774 B1 | * | 4/2002 | Emori et al. ................ | 235/492 |

* cited by examiner

Primary Examiner—Richard Elms
Assistant Examiner—Michael K. Luhrs
(74) Attorney, Agent, or Firm—Antonelli, Terry, Stout & Kraus, LLP

(57) ABSTRACT

The existing IC cards have a disadvantage of difficulty of mass production because an IC chip is supplied on a substrate one at a time. The present invention provides a method of manufacturing by placing a positioning jig having a plurality of openings each of which has a size fit with a semiconductor device, providing a plurality of semiconductor devices on said jig to house the devices into the openings, and fixing on a substrate then cutting the substrate to provide independent electronic devices. When the semiconductor device is in a form of chip, a support member attached to the chip will facilitate the handling of chips.

22 Claims, 15 Drawing Sheets

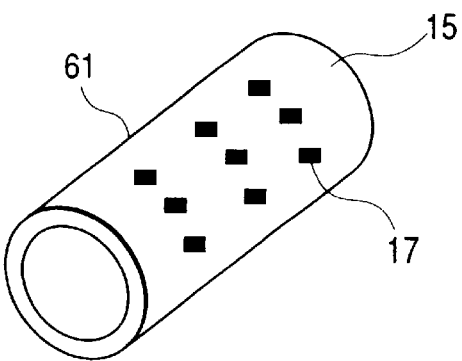
FIG. 6(a)
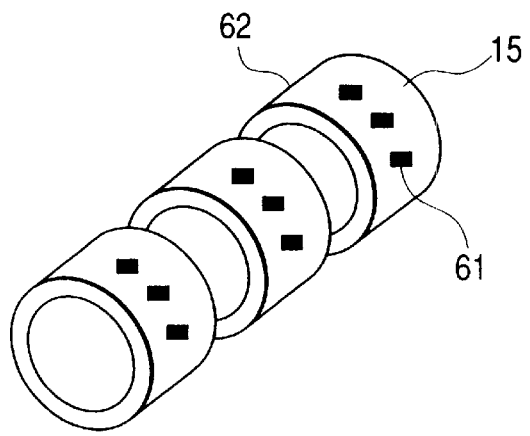
FIG. 6(b)
FIG. 7
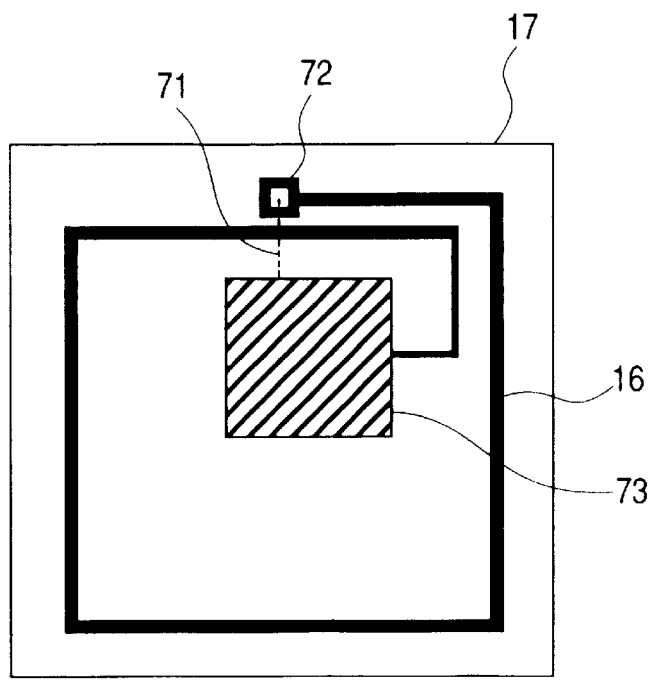

METHOD OF MANUFACTURING AN ELECTRONIC DEVICE

BACKGROUND OF THE INVENTION

1. Field of the Invention

The present invention relates to a method of manufacturing an electronic device and more particularly to a method of manufacturing an electronic device equipped with a semiconductor integrated circuit, including IC cards, valuable papers, contactless identification devices and the like.

2. Description of the Prior Art

Recently, some electronic devices are estimated to have a promised potential that these devices, including IC cards equipped with an IC chip, a tag, and an identification devices by radio frequency technology, may incorporate a functionality in addition to the recognition of bar codes of the prior technology.

Now an exemplary method of manufacturing an IC card in accordance with the prior technology will be described with reference to FIGS. 14(a) to 14(c). As shown in FIG. 14(a), a thin IC chip 17 will be sucked from a pellet case 142 by means of a vacuum absorber 141. Then the picked up IC chip 17 will be transferred on an IC card substrate 15 (base film) having some adhesive paste applied thereon and pressed on it to fix thereon (see FIG. 14(b)). Thereafter the IC chip 17 attached will be covered by a covering sheet 19, as shown in FIG. 14(c)

Another example of attaching a semiconductor chip onto a base film is disclosed in the Japanese Patent Application Laid-Open No. Hei 08-316194. The method disclosed therein will be described with reference to FIGS. 2(a) to 2(c). In this example, as shown in FIG. 2(a), a plurality of semiconductor chips 17 having an antenna 16 is attached on a supporting sheet, these chips 17 will be pushed on a base film 15 having paste material 14 by means of a press head 21. Thereby the thin IC chips will be transferred and fixed on the film base as shown in FIG. 2(b). FIG. 2(c) is a cross-section indicating the chip and film encapsulated by an adhesive material 18 thereafter.

In the prior techniques as have been described above, the productivity is low because an IC chip is attached one at a time on a substrate. For example, in the method shown in FIGS. 14(a) to 14(c), the improvement of productivity will be limited because each chip is sucked and transferred one at a time. In the prior method shown in FIGS. 2(a) to 2(c), the press head is registered with each of chips to press one by one, the mechanism of assembly machine will become complex. In addition, a certain gap between two adjoining chips will be required during the transfer. This results in a difficulty of lowering the manufacturing cost.

In addition, if the thickness of IC chips to be delivered is for example equal to or less than 10 micrometers, the IC chip will be curled due to the internal stress of the semiconductor material. Thus, this may cause a damage in the chip, which will deform from a curled shape to a plane shape when sucked. In addition, since the chip is very thin, the sucking force of the vacuum sucker may result in a local deformation of the chip, leading to a change of device characteristics by the stress applied to the devices on the chip.

SUMMARY OF THE INVENTION

The present invention has been made in view of the above circumstances and has an object to overcome the above problems and to provide a method of manufacturing an electronic device, suitable for mass production of such devices equipped with a semiconductor integrated circuit.

Another object of the present invention is to provide a method of manufacturing an electronic device, with a lower cost and a higher reliability.

Yet another object of the present invention is to provide a method of manufacturing an IC chip suitable for the method of manufacturing an electronic device as have been described above and ease in processing.

To achieve the object and in accordance with the purpose of the invention, as embodied and broadly described herein, this invention comprises a method of manufacturing an electronic device, comprising the steps of: providing a frame having a plurality of openings on a substrate to be mounted with a semiconductor device, each opening has a dimension suitable to the semiconductor device; providing a plurality of semiconductor devices to the frame to seat one in each of the openings; and fixing the semiconductor devices to the substrate.

By means of a frame having a plurality of openings, a number of semiconductor devices may be supplied to predetermined positions on the substrate at once.

By means of a film-based substrate as the substrate, mass production will be facilitated. In addition, the productivity will be further improved by rolling up and rewinding the base film.

By means of a paper sheet as substrate, the product may be used for the valuables.

To achieve the another object and in accordance with the purpose of the invention, as embodied and broadly described herein, this invention comprises a method of manufacturing an electronic device, comprising the step of: using a thinner IC chip than 30 micrometers for the semiconductor device.

By using a thin film chip, the reliability thereof will be improved due to the strength with respect to the bending stress. The strength with respect to the bending stress may be significant when the thickness is equal to or less than 10 micrometers.

To achieve effectively the yet another object and in accordance with the purpose of the invention, as embodied and broadly described herein, this invention comprises a method of manufacturing an electronic device, comprising the step of: providing a supporting dowel member on the surface or on the backside or on both sides of a thin IC chip.

A support member will improve the resistance to the external stress to facilitate the handling. In particular, the fracture of chips during supplying the thin IC chip onto the frame may be considerably reduced. The thin IC chips will also be placed with a significant certainty on the openings of the frame. Furthermore, the curling of chips when the chips are thinner may be prevented or suppressed.

By forming the semiconductor device in a shape of cube, the resistance to the external stress will be increased to improve the reliability. In particular, the breakage of corner of the chip will be significantly reduced by forming the maximum dimension of 0.5 millimeters or less.

By forming the semiconductor device in a shape of sphere, the resistance to the external stress will be further increased more than a cube form, because no corner exists.

In particular the application of the semiconductor device to a thin electronic device including IC cards, tags, and valuables will be allowed when forming the external dimension of the semiconductor device (length of an edge for a cube and a chip, or diameter for a sphere) equal to or less than 0.5 millimeters.

By providing an optical shielding member on the semiconductor chip, the effect influenced by the incident light to the semiconductor device on the electron-hole pairs may be avoided.

By means of a sheet material having a light shield characteristics for the shield material, the influence by the incident light may be positively avoided. By using printing ink for the shield material, the shield may be formed in an inexpensive manner.

To achieve the yet another object of the present invention, the method in accordance with the present invention comprises the steps of: providing a wall pattern onto the part corresponding to the separating region between semiconductor devices in a semiconductor substrate having a plurality of semiconductor devices; forming a support member having a certain mobility and allowing a bonding after curing onto the part corresponding to the semiconductor devices; and splitting the semiconductor device part into chips.

The mobility of the support member before curing allows the supply at once of the support member to a plurality of inner wall regions surrounded by the wall patterns, therefore improves the productivity. The support member, which can be melted after curing, is particularly suitable to thinner electronic devices because after assembly into an electronic device the member can be melted to reduce the thickness.

By screen-printing of the support member, a mass production will be allowed at a less cost.

By means of a support member of a photosensitive material, the controllability of shapes inherent will allow a mass production.

The above and further objects and novel features of the present invention will more fully appear from following detailed description when the same is read in connection with the accompanying drawings. It is to be expressly understood, however, that the drawings are for the purpose of illustration only and not intended as a definition of the limits of the present invention.

BRIEF DESCRIPTION OF THE DRAWINGS

FIGS. 6(a) to 6(b) are perspective views indicating a wound roll of substrate with IC chips in accordance with the present invention;

FIG. 7 is a plan view indicating an example of IC chip to be mounted in an electronic device in accordance with the present invention;

DETAILED DESCRIPTION OF THE PREFERRED EMBODIMENTS

[First Embodiment]

Figure 1A:
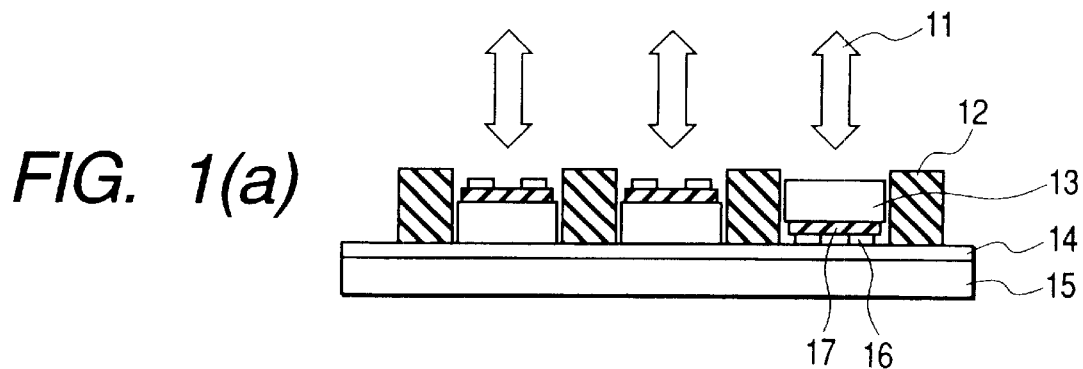
FIGS. 1(a) to 1(d) are schematic cross-sectional views indicating a method of manufacturing an electronic device in accordance with the present invention.

A method of manufacturing a number of electronic devices by attaching a plurality of IC chips (thin chips) 17 onto a substrate 15 at once will be described in greater details by referring to FIGS. 1(a) to 1(d). In this embodiment, a film-based substrate is used for the substrate 15. On the substrate 15 having some adhesive paste 14 applied, a registration jig (positioning frame) 12 having openings of the size corresponding to the IC chip 17 will be placed to supply a plurality of IC chips 17 into the openings. The depth of the opening in the jig is preferably such that an opening houses one IC chip. When a support material 13 is provided, the size of the openings should include the thickness of the member. The depth should be enough to encompass the chip, because the portion extending from the jig of an IC chip may be likely damaged by mechanically abrading with another IC chip if the opening has an insufficient depth. The supply of IC chip 17 to the opening can be performed by means of a vacuum sucker having a plurality of sucking ports each corresponding to the position of respective of a plurality of openings, by attracting a plurality of IC chips at once. FIG. 1(a) indicates a schematic cross-sectional view of thin chips 17 each having a support member 13 and each placed in the respective of openings of the registration jig 12 to fix onto a film base substrate 15 by means of suction and push-out air 11. On the surface of thin chips a small antenna 16 for transmitting and receiving energy and data by means of radio frequency. A contactless electronic device may be thereby provided.

Figure 13:
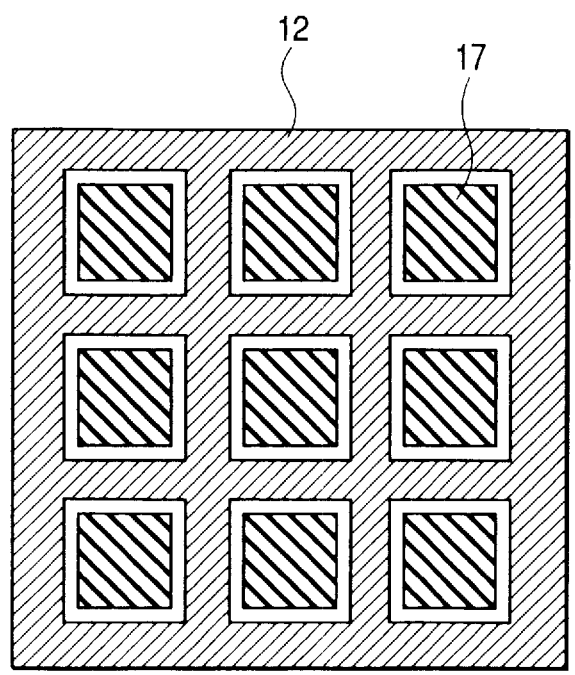
FIG. 13 is a plan view indicating the method of manufacturing an electronic device in accordance with the present invention.
Figure 14A:
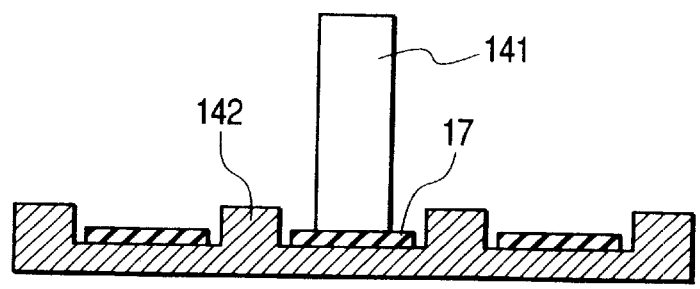
FIGS. 14(a) to 14(c) are schematic cross-sectional views indicating another method of manufacturing an IC card in accordance with the Prior Art.
Figure 14B:
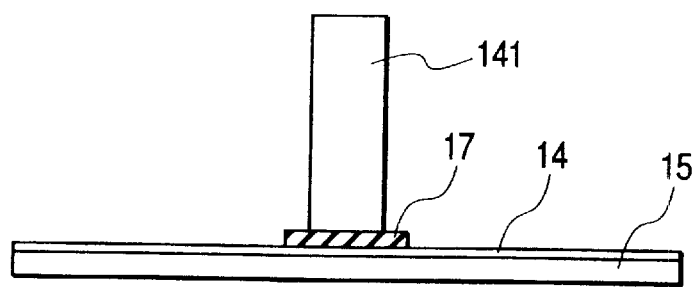
Figure 14C:
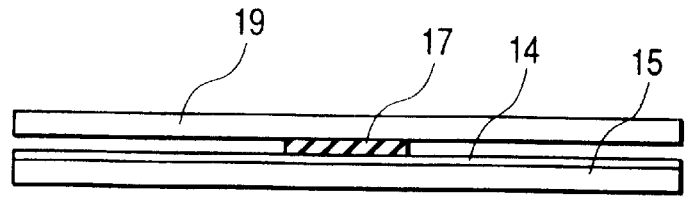

FIG. 13 is a plan view of registration to a jig, for aligning thin chips 17 to the jig. The jig has a through hole or a recess of the shape and size corresponding to the size of chip or a square. A thin chip will be fitted into the through hole or recess. The automatic registration will be performed while at the same time the mounting will be pressed to adhere automatically to the substrate.

Figure 1B:
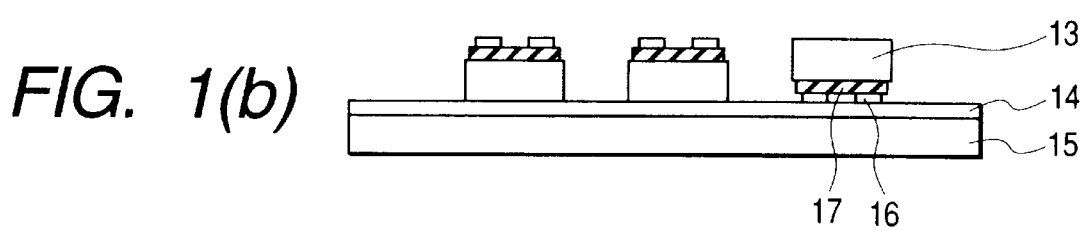

Next, as shown in FIG. 1(b), the positioning jig 12 will be removed.

Figure 1C:
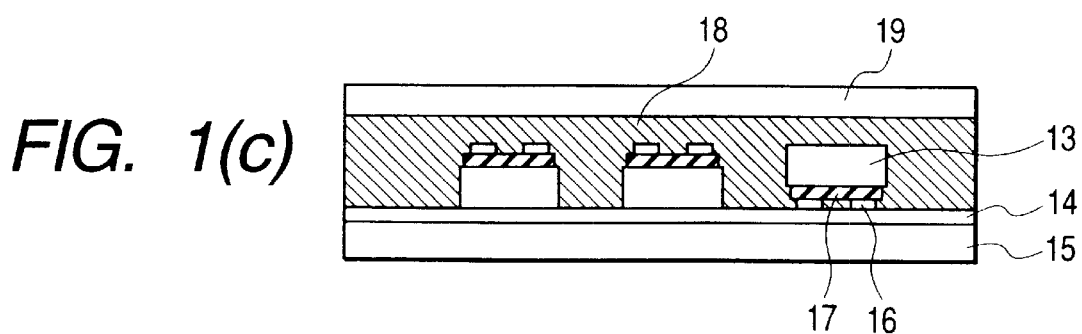

Then, a covering sheet 19 will be placed on an adhesive material 18 (see FIG. 1(c)).

Figure 1D:
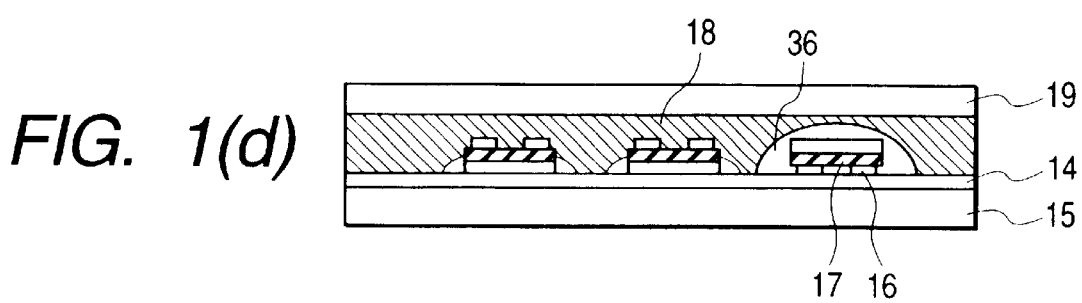
Figure 2A:
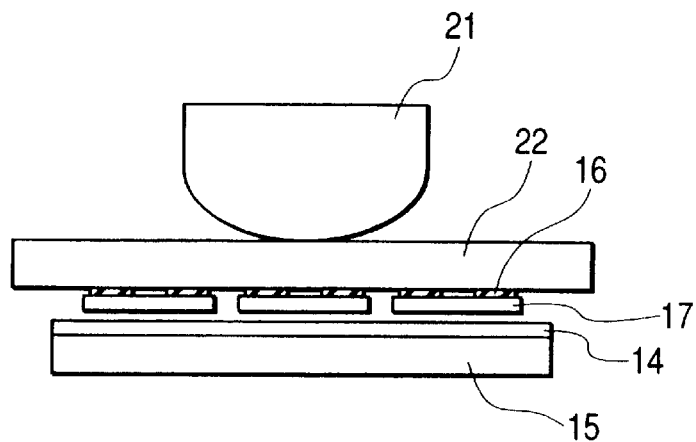
FIGS. 2(a) to 2(c) are schematic cross-sectional views indicating a method of manufacturing an IC card in accordance with the prior art.
Figure 2B:
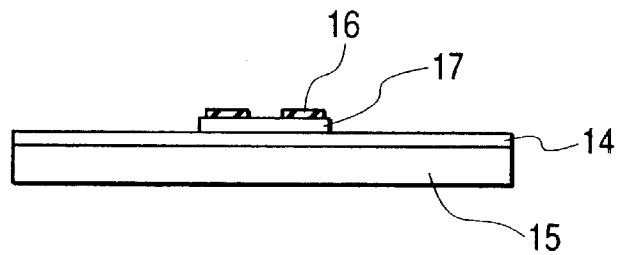
Figure 2C:
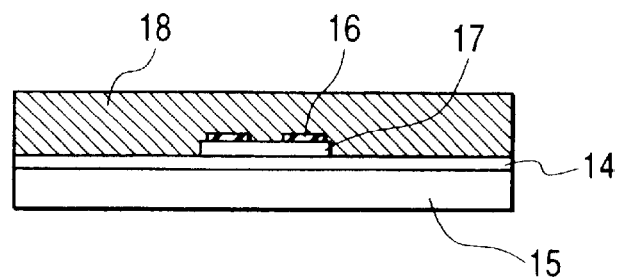

Thereafter, the support member 13 will be melted to flow by applying heat and pressure to reduce the thickness of the electronic device (see FIG. 1(d)). Then, the IC card substrate 15 will be cut so as to have the desirable number of thin IC chips 17 (one or more) to form an electronic device. In accordance with this method, the thin chip 17 will be stable during handling due to the support member 13. In the eventual form, the support member 13 will be deformed so as to conform to the thin shape and size of the final product. Since the IC chip 17 is thin, the chip may be curled due to the internal stress of the semiconductor material and is susceptible to the physical external stress, however by means of support member 13 as have been described above in this embodiment, a mechanical strength nearly equivalent to a thicker chip can be achieved so that a production of a number of thin chips at the same time will be allowed, with ease of handling, resulting in a significant improvement of productivity.

[Second Embodiment]

Now a method of attaching a support member to a thin chip will be described in greater details by referring to FIGS. 3(a) to 3(e).

Figure 3A:
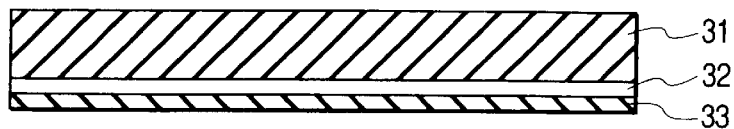
FIGS. 3(a) to 3(e) are schematic cross-sectional views indicating a method of formation of a support member in accordance with the present invention.

FIG. 3(a) is a schematic cross-sectional view of a silicon-on-insulator type (SOI) wafer having a silicon substrate 31 (of thickness of approximately 200 micrometers), an oxide layer 32 (of thickness of approximately 1 micrometer), and a surface device layer 33 (of thickness of 0.5 to 10 micrometers) having semiconductor IC devices formed in a manner well known in the art.

Figure 3B:
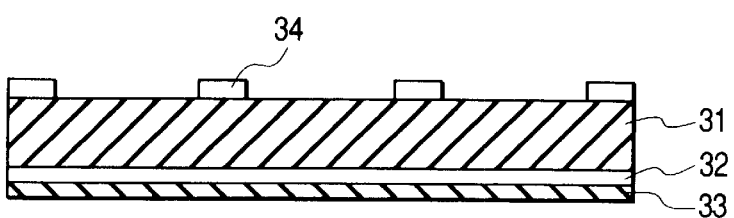

FIG. 3(b) is a schematic cross-sectional view during a process of forming an oxide pattern 34 (of thickness of approximately 0.5 micrometers) on the backside of the silicon-on-insulator wafer. The oxide pattern 34 may also be formed by a photolithograph as well known in the art. The oxide pattern 34 will be formed in the region used for separating semiconductor devices.

Figure 3C:
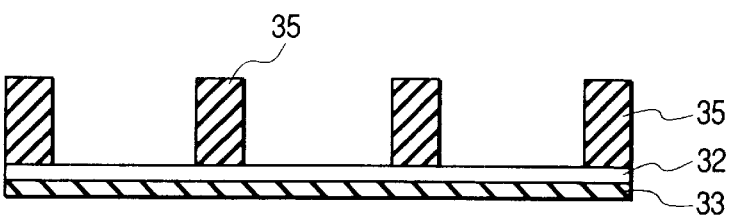

FIG. 3(c) is a schematic cross-sectional view of the process of etching the silicon by making use of the oxide pattern formed thereon to leave the silicon sacrifice wall 35 and remove the oxide. When using a SOI wafer the oxide layer 32 is served for a protection of silicon etching so as to provide a precise control of the thickness of the silicon sacrifice wall 35. However, when using an ordinary silicon substrate, the manufacturing cost can be lowered whereas the thickness controllability will be somewhat degraded when compared with a silicon-on-insulator wafer. Silicon can be processed in a shorter period of time by using a wet type etching method. On the other hand, the silicon can be processed with a higher precision of pattern by using a dry etching method. In the dry etching, the etching rate will be lower than the wet etching. Thus, the throughput may be improved by polishing the surface of the silicon substrate 31 or by previously thinning by means of the wet etching or the like.

Figure 3D:
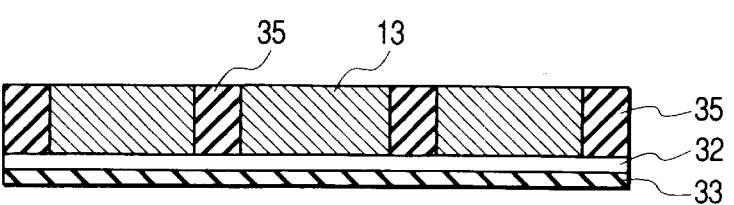

FIG. 3(d) is a schematic cross-sectional view indicating the support member 13 filled into the area from which the silicon has been removed (the area will correspond to the semiconductor IC devices region). The preferable support member 13 may be selected from a group of candidates, which will be melted and flowed by heating. For example, some examples of the support member 13 include wax and epoxy resin.

Figure 3E:
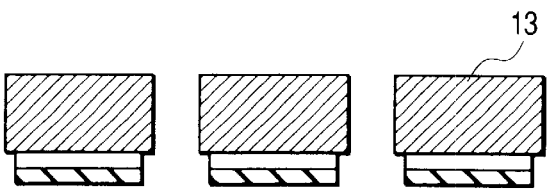

FIG. 3(e) is a schematic cross-sectional view indicating the oxide layer 32 and the surface device layer 33 are removed by etching. By providing a size of the support member 13 larger than the semiconductor chip, the resistance to the external stress will be improved. In accordance with this method, the support member may be formed at a higher accuracy by selecting an arbitrary support member material. In addition, the process will be performed on the wafer, allowing a further effect of providing a considerably excellent productivity.

It should be noted here that although in this embodiment a silicon-on-insulator substrate is used, a substrate made of an ordinary silicon material may be used to render the process cost lower at the price of the variation of thickness of the IC chips.

[Third Embodiment]

Another method of forming the support member 13 will be described in greater details by referring to FIGS. 4(a) to 4(e).

Figure 4A:
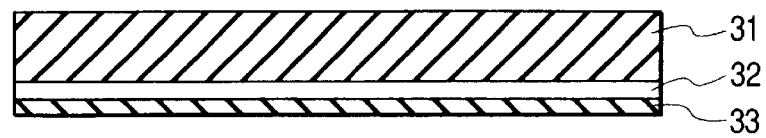
FIGS. 4(a) to 4(e) are schematic cross-sectional views indicating another method of manufacturing a support member in accordance with the present invention.

First a silicon-on-insulator type wafer is provided having a silicon substrate 31, an oxide layer 32, and a surface device layer 33 having semiconductor integrated circuit devices formed thereon (see FIG. 4(a)).

Figure 4B:
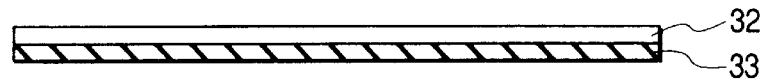

The silicon substrate 31 will be etched to be removed (see FIG. 4(b)). The oxide layer 32 will be served for a protector of silicon etching.

Figure 4C:
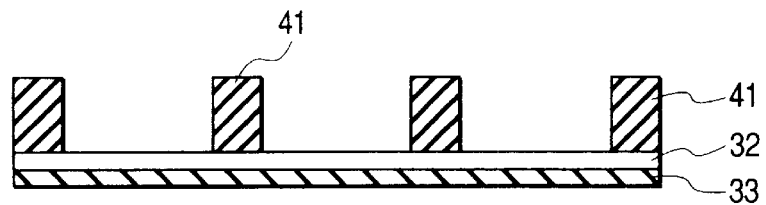

Then, using a photo-resist technology, a photo-resist sacrifice wall 41 will be formed (see FIG. 4(c)).

Figure 4D:
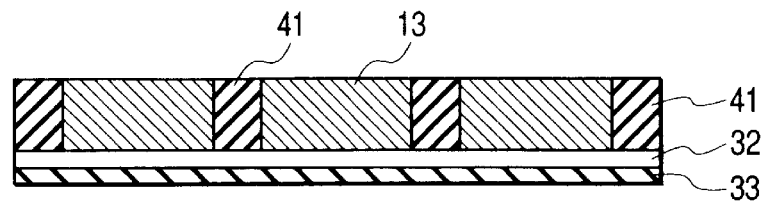

Thereafter a support member is filled between photo-resist sacrifice wall patterns 41 (see FIG. 4(d)).

Figure 4E:
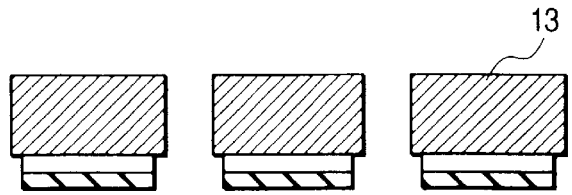

Thereafter, the oxide layer 32 and the surface device layer 33 will be etched to be removed (see FIG. 4(e)). In accordance with this method, the support member may be formed at a higher accuracy with an arbitrary material selected. Since the process is performed on the wafer, the method will provide an effect of considerably excellent productivity. In this method the height of the wall pattern will be determined by the thickness of the resist layer, so that the range of adjusting the height will be narrower than the method in accordance with the second embodiment, however, the formation of the oxide layer 32 will be unnecessary, facilitating the photo-resist sacrifice wall 41 to be readily formed.

[Fourth Embodiment]

Figure 5:
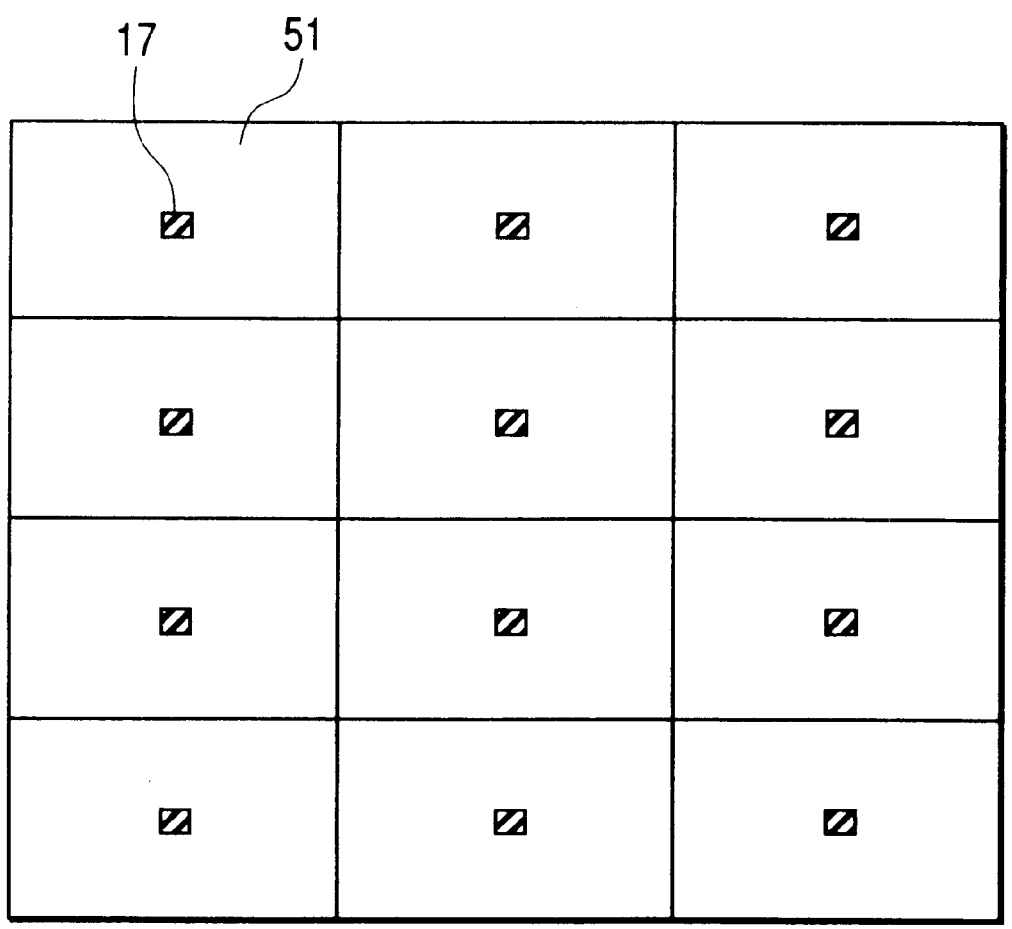
FIG. 5 is a plan view of a base film substrate for an IC card equipped with an IC chip in accordance with the present invention.

An embodiment in which the electronic device is an IC card will be described in greater details by referring to FIG. 5. IC cards are used in a vast field of application, and it is anticipated that a number of cards in some fields will be disposable. Therefore, a significant consideration is needed on the thin chip equipped on an IC card film base 51 made of the film base described earlier. FIG. 5 is an embodiment of such an IC card. More specifically, a film base substrate in the size of a name card having chips mounted in a dispersed manner will allow the use of such a substrate as a card, provide a method of manufacturing IC cards at a considerably thinner card at a lower cost, and promote the use of such a card. By incorporating an antenna into the thin IC chip 17, a contactless IC card can be yielded.

[Fifth Embodiment]

FIGS. 6(a) and 6(b) show another embodiment in accordance with the present invention. FIG. 6(a) is an overview of a roll before cutting 61 having thin IC chips mounted thereon, which later will be sliced. The thin IC chips 17 are adhered onto the film based IC card substrate 15. FIG. 6(b) is a roll 62 sliced to a predetermined width of the roll before cutting 61 not yet sliced as shown in FIG. 6(*a*). Each chip is mounted on the sliced roll, allowing to use as a tape. By making a roll tape by slicing a large sheet incorporating a plurality of thin chips thereon, a mass production of electronic devices will be provided.

[Sixth Embodiment]

FIG. 7 shows an exemplary plan view of a thin IC chip 17 used in an embodiment in accordance with the present invention. More specifically, a chip having an antenna 16 as shown in the figure will be effectively utilized in the present invention. An effective resonance circuit may be formed with an antenna 16 and a tuning capacitance 73 connected by a connection wiring 71 through a through hole 72. In the microwave band, the inductance and capacitance may be sufficient to be very small values, such as 4.2 pxn (H·F), so that a resonance circuit can be built with an extremely small inductor and a capacitor, allowing the formation of on-chip antenna to be effectively arranged. The present invention provides a method of manufacturing taking into consideration the economical efficiency.

Figure 18:
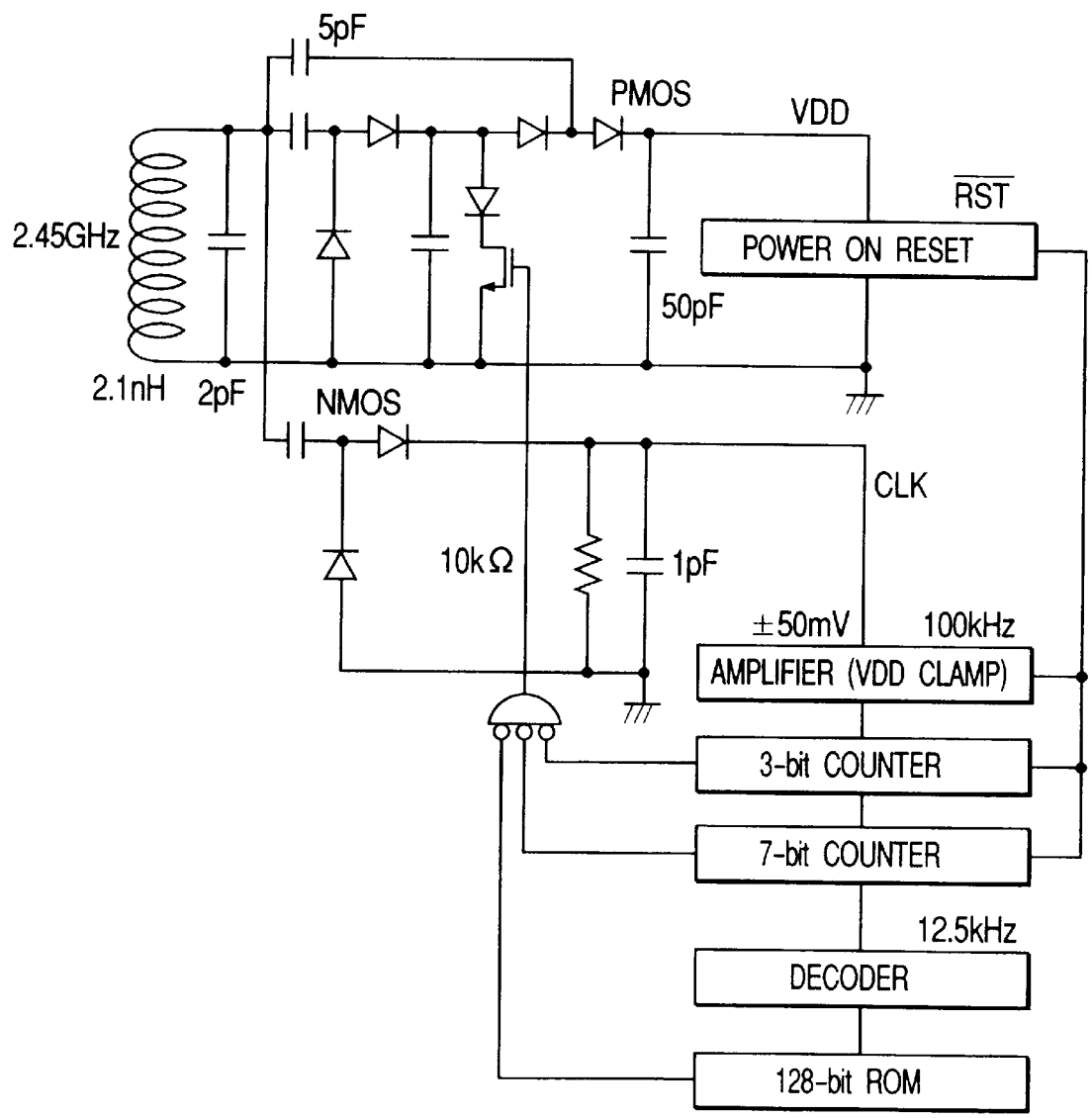
FIG. 18 is a schematic circuit diagram of an exemplary circuit formed in an IC chip of the electronic device in accordance with the present invention.
Figure 19A:
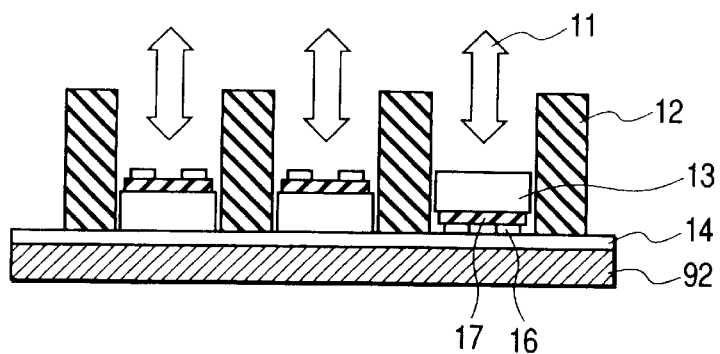
FIGS. 19(a) to 19(d) are schematic cross-sectional views indicating the method of manufacturing an electronic device in accordance with the present invention.
Figure 19B:
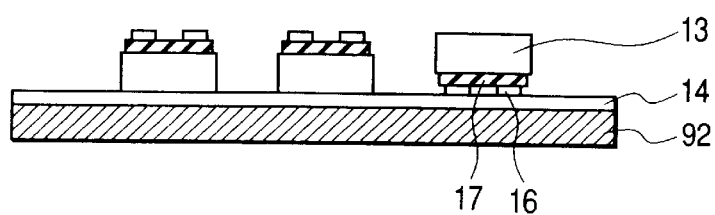
Figure 19C:
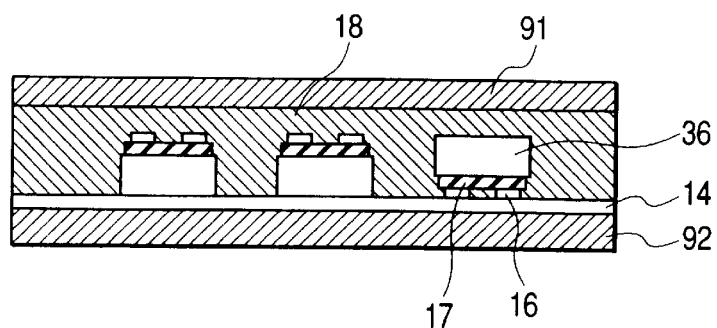
Figure 19D:
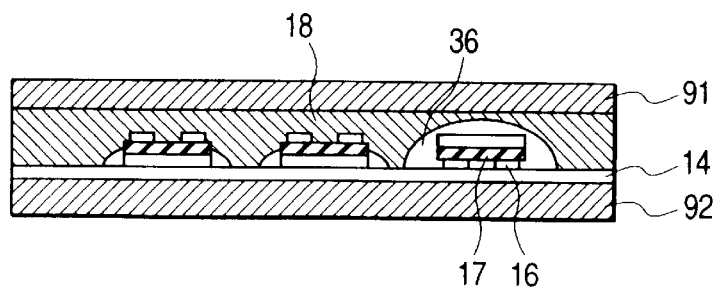

FIG. 18 shows an example of a circuit formed in an IC chip. The circuit is a very promising one, which can be served for receiving microwave signals to transmitting data. This circuit has numerous features and characteristics such as converting the electromagnetic energy of the received microwaves into a direct current voltage, and receiving clock signals. By using microwaves, an antenna of a microscopic size of for example 300 micrometers square or less can be used for this purpose. Thereby an antenna is allowed to be incorporated in an IC chip.

By using a thin IC chip having an antenna as have been described above, a contactless electronic device will be provided.

[Seventh Embodiment]

Figure 8A:
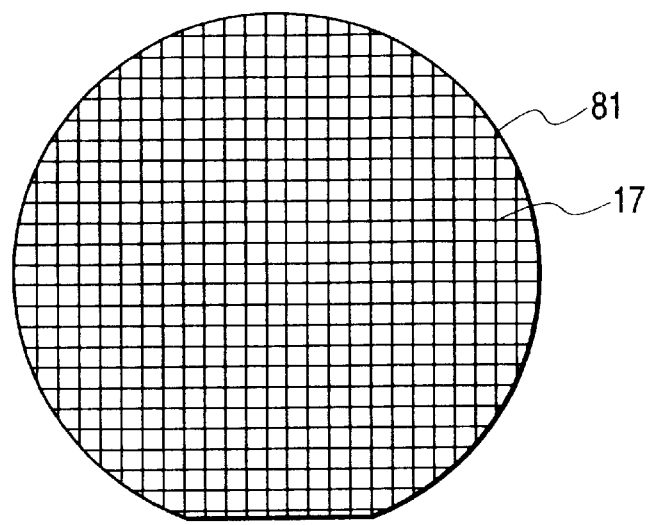
FIGS. 8(a) to 8(c) are series of processes for forming a support member in accordance with the present invention onto a wafer, (a) a plan view, (b) and (c) schematic cross-sectional views.
Figure 8B:
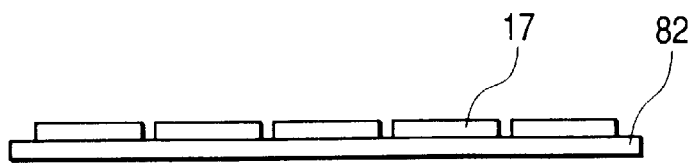
Figure 8C:
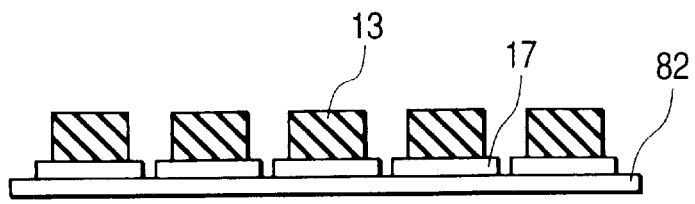

In this embodiment, another method of forming the support member 13 will be described in greater details by referring to FIGS. 8(*a*) to 8(*c*). FIG. 8(*a*) is a plan view of a silicon wafer 81. FIG. 8(*b*) is a partially sectional view of a portion shown in FIG. 8(*a*). In the cross-sectional view the silicon wafer 81 is affixed on a supporting sheet 82, each chip is thinner and separated from each other. FIG. 8(*c*) is a schematic cross-sectional view illustrating the support member 13 required in the present invention is formed by screen-printing. For the material a silver paste and conductive carbon ink may be used.

The efficiency of the present invention is in the formation of the support member at a lower cost. Screen-printing may allow the support member to be easily formed on a wafer.

[Eighth Embodiment]

Figure 9:
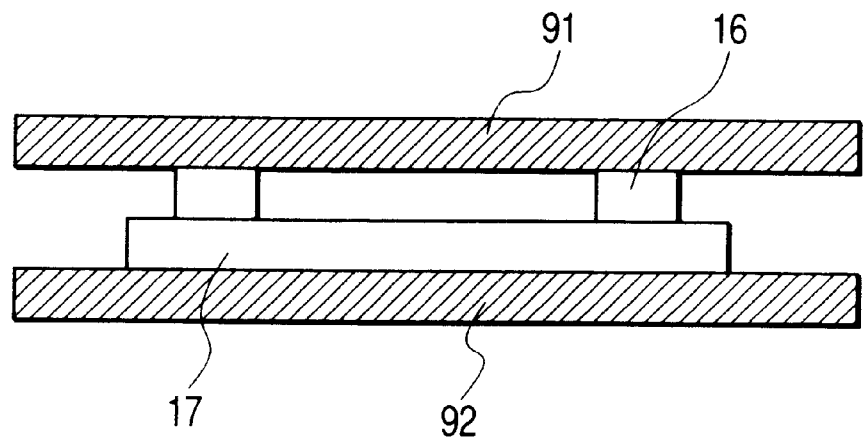
FIG. 9 is a schematic cross-sectional view of an electronic device in accordance with the present invention.

FIG. 9 shows still another preferred embodiment of the present invention. A thin chip as an inevitable mode of implementation is expected to be implemented in a thin form of product. The technology required in the implementation to be cited herein may include a protection of malfunctions by optics. A countermeasure for this purpose is shown in this figure, in which a light shield may be added on top and bottom of the antenna 16 formed on a thin IC chip 17 by means of an upper shield sheet 91 and a lower shield sheet 92. This may provide an electronic device, which is protected from the malfunctioning in a thinner chip.

By using a shield sheet having a larger surface area than the thin IC chip 17 the incident light may be effectively shaded. In addition, the shielding member may be formed at once on a wafer, prior to separating chips, to allow the cost to decrease. Furthermore, the shielding members may be either on top or on bottom, depending on the application.

The shielding member formed by printing will further decrease the manufacturing cost.

[Ninth Embodiment]

Figure 10:
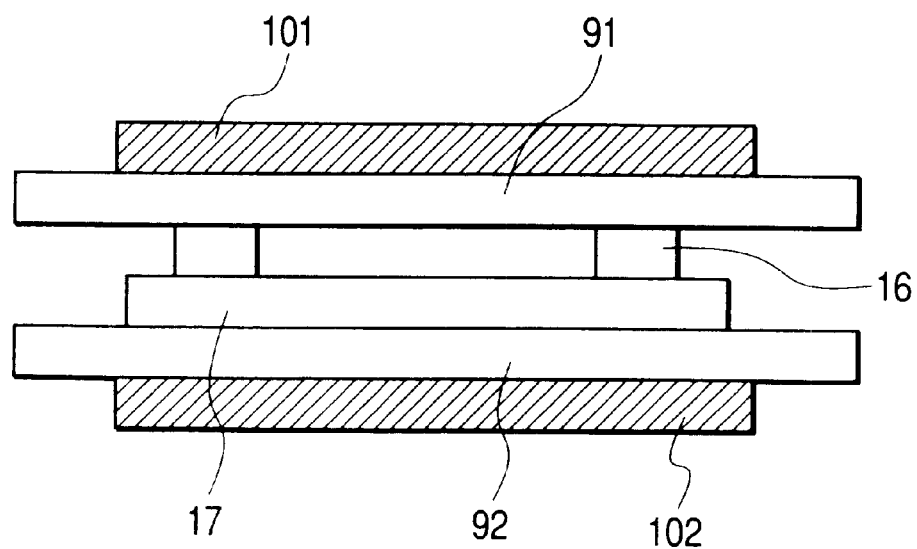
FIG. 10 is a schematic cross-sectional view of another electronic device in accordance with the present invention.

A method of shielding incident light will be further described by referring to FIG. 10. In FIG. 9, there are the upper shielding mask sheet 91 and the lower shielding mask sheet 92, which are formed on both sides of the thin IC chip 17 and the antenna 16 formed thereon, thereafter upper shielding mask ink 101 and lower shielding mask ink 102 will be formed thereon to have a functionality to complete the shield such that the top shielding sheet 91 and the bottom shielding sheet 92 do not work sufficiently as expected due to the transparency. Ink may be provided as the printing patterns. This allows the shielding to be improved.

[Tenth Embodiment]

Figure 11A:
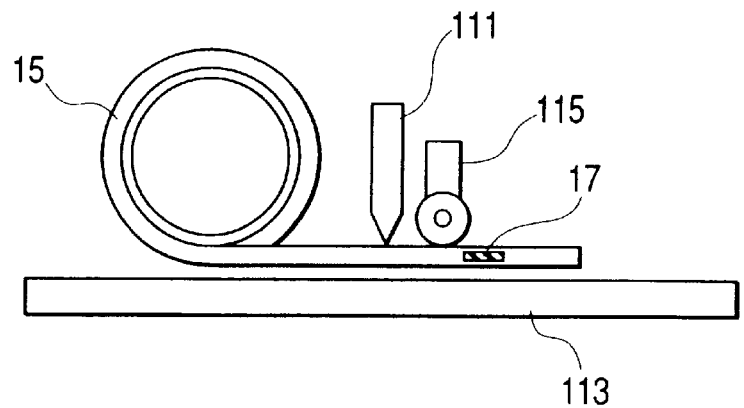
FIGS. 11(a) to 11(c) are schematic cross-sectional views indicating the method of an electronic device in accordance with the present invention.
Figure 11B:
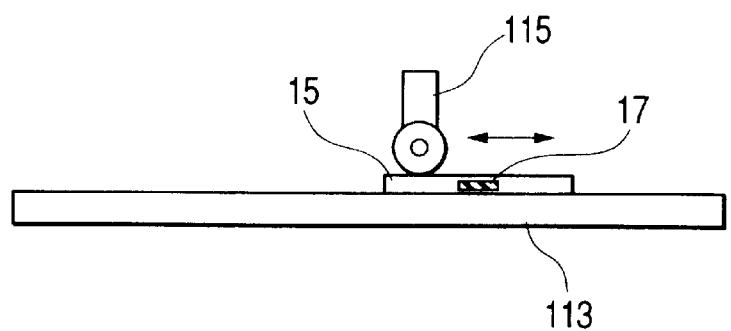
Figure 11C:
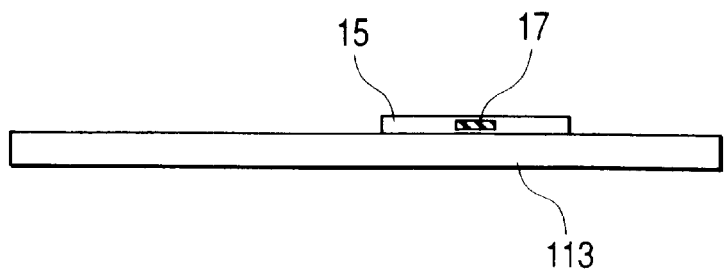

A method of forming an electronic device by cutting a film in a form of roll tape having a plurality of IC chips mounted to separate to pieces, and attaching a piece to a medium will be described in greater details by referring to FIGS. 11(*a*) to 11(*c*). FIG. 11(*a*) is a schematic cross-sectional view of an example arrangement of a tape cutter 111 and tape rollers for outspreading the rolled tape in accordance with the present invention on a medium 113. FIG. 11(*b*) is a schematic diagram of adhering the tape including thin chips onto the medium by means of the tape rollers. FIG. 11(*c*) is the mating of a piece with the medium. In this embodiment, the tape including thin chips is so thinner that the adhesion to a medium will be performed without problem, allowing electronic devices to be manufactured in a bulk at a lower cost.

[Eleventh Embodiment]

Figure 12:
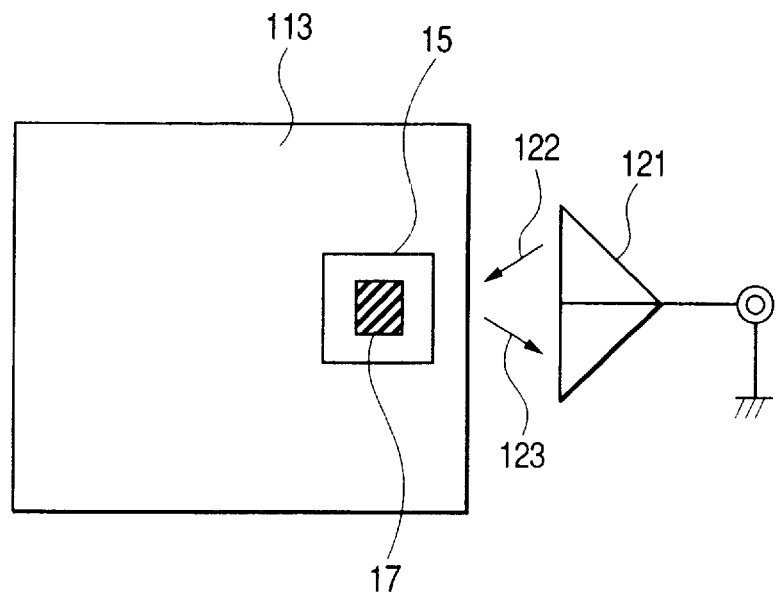
FIG. 12 is a schematic diagram indicating a mode embodying the electronic device in accordance with the present invention.

An example of use of the electronic device in accordance with the present invention will be described by referring to FIG. 12. An interrogator antenna 121 will transmit a radio frequency transmission 122 toward the IC chip 17, which is mounted on the IC card substrate 15, to feed the received radio frequency waves to the interrogator antenna 121 by means of an effective circuit technology. This can be implemented without a battery or power source, by obtaining the energy needed to operate the circuit from the interrogator antenna 121 to send back any data necessary to the interrogator. The thin IC chip may be attached to any type of mediums 113.

[Twelfth Embodiment]

Figure 15A:
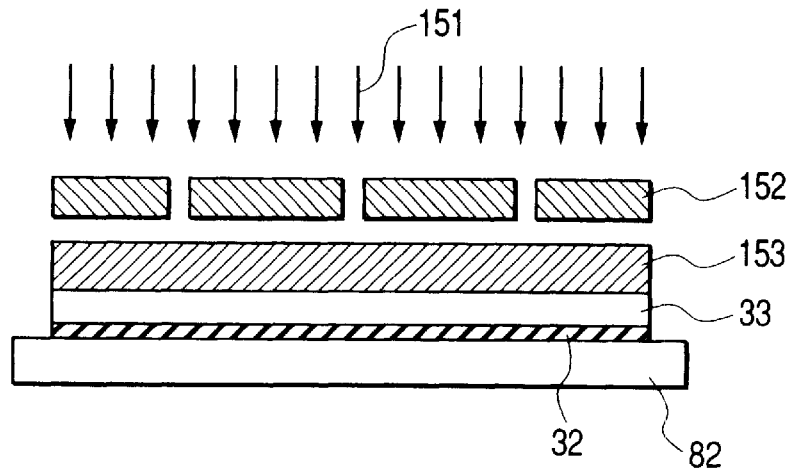
FIGS. 15(a) to 15(c) are schematic cross-sectional views indicating another method of manufacturing a support member in accordance with the present invention.
Figure 15B:
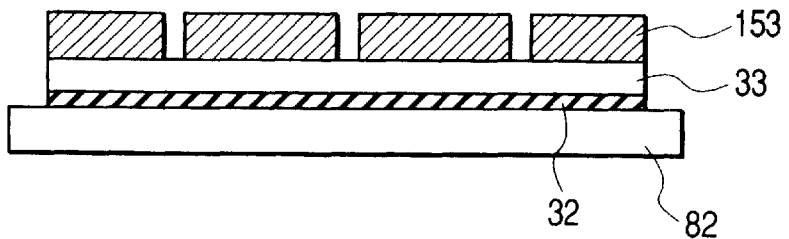
Figure 15C:
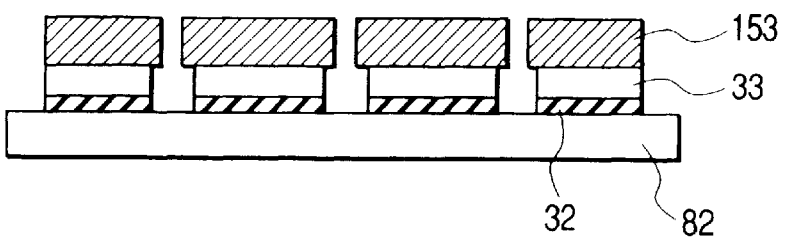

Another embodiment of forming a support member is shown in FIGS. 15(*a*) to 15(*c*). After removing the silicon substrate on the backside of the silicon-on-insulator substrate, a supporting sheet 82 will be attached on the side of the oxide layer 32. Then, on the surface side of the surface device layer 33 having semiconductor integrated circuit devices formed a resist layer 153 will be applied to the thickness of approximately 50 micrometers, then the irradiating beam 151 will be applied to the photosensitive material 153 through a photomask 152 (see FIG. 15(*a*)). The thickness of the resist layer 153 may be in the range of approximately 5 to 100 micrometers. Thus the thinner the supporting effect is small, the thicker the layer is difficult to form. The accuracy of the size of patterns of the support member may be sufficient in the range of ±5 micrometers or so.

Thereafter, the exposed area (corresponding to the chip separator area) will be developed to be removed (see FIG. 15(*b*)).

Figure 16:
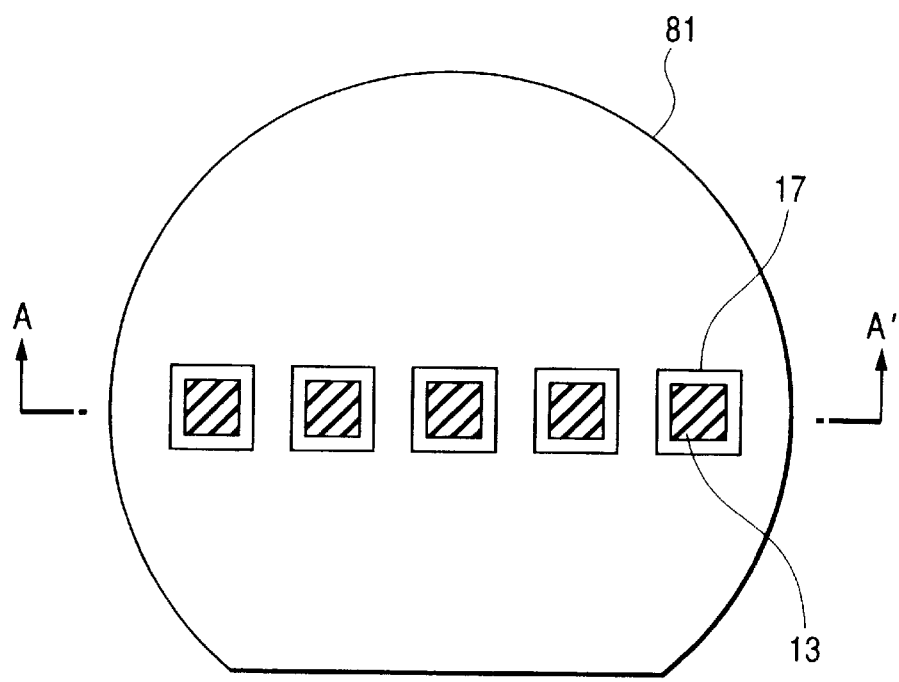
FIG. 16 is a plan view indicating the method of manufacturing of a support member in accordance with the present invention.

Next, the surface device layer 33 in the area that the photosensitive material 153 has been removed will be removed (see FIG. 15(*c*)). FIG. 16 shows a plan view. In FIG. 16 only a line of chips is shown for the sake of simplicity, however in a practical production a number of chips exist on a wafer (for example, 330,000 chips on a 8" wafer). As can be appreciated, by using the photosensitive material as the support member, the support can be easily formed on a wafer. The support member has another advantage in the aspect of efficiency that it can be formed by only one lithograph process on a wafer. By forming thin chips equal to or less than approximately 10 micrometers, the resistance to the bending stress may be improved, at the price of difficulty in handling. However, a thinner chip with a support member attached in advance will considerably improve the processability of chips.

[Thirteenth Embodiment]

Figure 17:
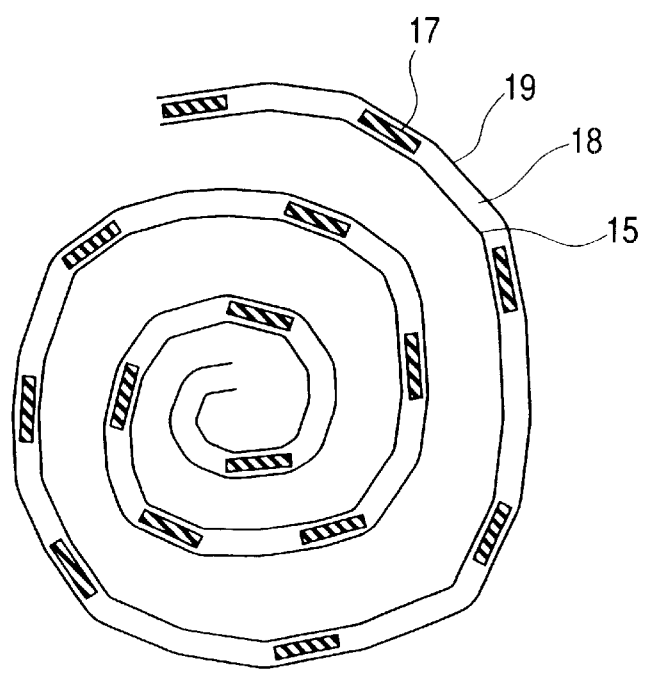
FIG. 17 is a schematic cross-sectional view indicating a wound roll of substrate with IC chips equipped in accordance with the present invention.

FIG. 17 shows a wound roll of tape substrate 15 with the thin IC chips 17 mounted thereon. In the tenth, preferred embodiment as have been described above, the IC card substrate 15 with the thin chips 17 mounted thereon is cut to make pieces to install on another medium 113. In this embodiment the tape substrate 15 itself, which is cut to include required thin chips are used as the electronic device. A mottled whorl in this figure is the schematic cross-sectional view of the arrangement underlying the present invention. More specifically, the tape medium (in this embodiment the tape substrate itself) having thin IC chips 17 mounted thereon may be wounded like a roll of toilet tissue to be reeled without jag. Semiconductors mounted on a cellophane adhesive tape may be achieved at a very lower cost in accordance with the present invention, resulting in a potential to widely spread. A convenience may be significantly improved, by having intelligence with the equivalent handling to the usual scotch tapes.

[Fourteenth Embodiment]

FIGS. 19(a) to 19(d) show another embodiment in accordance with the present invention. In basics, this embodiment is similar to the first preferred embodiment as have been described above, however the IC card substrate 15 and the covering sheet 19 are replaced respectively with the bottom shielding sheet 92 and the top shielding sheet 91, both having the shield effect. This allows the shielding effect to be further improved to suppress or prevent the malfunctioning caused by the electron-hole pairs generated by the incident light.

The foregoing description of the preferred embodiments of the invention has been presented for purposes of illustration and description thereof. It is not intended to be exhaustive or to limit the invention to the precise form disclosed, and modifications and variations are possible in light of the above teachings or may be acquired from practice of the invention. The embodiments chosen and described in order to explain the principles of the invention and its practical application to enable one skilled in the art to utilize the invention in various embodiments and with various modifications as are suited to the particular use contemplated. it is intended that the scope of the invention be defined by the claims appended hereto, and their equivalents.

In accordance with the present invention, following effects may be expected. The reinforcement of thin chips allows the manufacturing processes to be performed in a manner similar to those used for the ordinary thicker chips, the batch handling of thinner chips in bulk to be realized, as sell as the productivity to be considerably increased. The support member which may melt and flow facilitate to provide a thinner electronic device.

It is further understood by those skilled in the art that the foregoing description is some preferred embodiments of the disclosed method and that various changes and modifications may be made in the invention without departing from the spirit and scope thereof.

What is claimed is:

1. A method of manufacturing an electronic device, comprising the steps of:
   providing a plurality of semiconductor devices each having an antenna on the surface;
   providing a substrate;
   providing a jig having a plurality of openings, each of which openings has a size corresponding to one of said semiconductor devices;
   providing said jig on said substrate;
   supplying a plurality of said semiconductor devices to said jig so that one semiconductor device is housed in each of said openings; and
   mounting said semiconductor devices to said substrate,
   wherein said jig is removed from said substrate after the mounting of said semiconductor devices.

2. A method of manufacturing an electronic device, comprising the steps of:
   providing a plurality of semiconductor devices each having an antenna on the surface;
   providing a paper sheet;
   providing a positioning jig having a plurality of openings, each of which openings has a size corresponding to one of said semiconductor devices;
   registering said paper sheet to said jig so as to place said jig on said paper sheet;
   supplying a plurality of said semiconductor devices to said jig so that one semiconductor device is housed in each of said openings; and
   fixing said semiconductor devices onto said paper sheet,
   wherein said jig is removed from said substrate after the mounting of said semiconductor devices.

3. A method of manufacturing an electronic device, comprising the steps of:
   providing a plurality of semiconductor chips each having an antenna and a support member formed thereon;
   providing a substrate;
   providing a jig having a plurality of openings, each of which openings has a size corresponding to one of said semiconductor chips having said support member;
   placing said jig onto said substrate;
   supplying a plurality of semiconductor chips each having said support member to said jig so that one semiconductor chip is housed in each of said openings; and
   fixing said semiconductor chips onto said substrate,
   wherein said jig is removed from said substrate after the mounting of said semiconductor devices.

4. A method of manufacturing an electronic device according to claim 3, wherein:
   the thickness of said semiconductor chips is equal to or less than 30 micrometers.

5. A method of manufacturing an electronic device, comprising the steps of:
   providing a plurality of semiconductor devices in the form of cube each having an antenna on the surface thereof;
   providing a substrate;
   providing a jig having a plurality of openings, each of which openings has a size corresponding to one of said cubic semiconductor devices;
   placing said jig onto said substrate;
   providing a plurality of cubic semiconductor devices on said jig to house said semiconductor device into a plurality of said openings;

fixing said cubic semiconductor devices onto said substrate.

6. A method of manufacturing an electronic device according to claim 5, wherein:
the length of an edge of said cubic semiconductor device is equal to or less than 0.5 millimeters.

7. A method of manufacturing an electronic device, comprising the steps of:
providing a plurality of semiconductor devices in the form of sphere each having an antenna on the surface thereof;
providing a substrate;
providing a jig having a plurality of openings, each of which openings has a size corresponding to one of said spherical semiconductor devices;
placing said jig onto said substrate;
supplying a plurality of spherical semiconductor devices on said jig so that one semiconductor device is housed in each of said openings; and
fixing said spherical semiconductor devices onto said substrate,
wherein said jig is removed from said substrate after the mounting of said semiconductor devices.

8. A method of manufacturing an electronic device according to claim 7, wherein:
the diameter of said spherical semiconductor devices is equal to or less than 0.5 millimeters.

9. A method of manufacturing an electronic device, comprising the steps of:
providing a semiconductor substrate having a plurality of semiconductor devices, each of which devices has an antenna;
forming a wall pattern of semiconductor on the backside of said semiconductor substrate by thinning a part corresponding to said semiconductor devices to a thickness equal to or less than 30 micrometers, while leaving part corresponding to the separator area of each of said semiconductor devices thicker than the part corresponding to said semiconductor devices;
providing a support member of said semiconductor devices on the inside of said wall pattern;
removing said wall pattern to separate said semiconductor devices each having said support member to a plurality of chips;
providing a substrate;
providing a jig having a plurality of openings, each of which opening has a size corresponding to one said semiconductor chip;
placing said jig on said substrate;
supplying a plurality of said semiconductor chips to said jig so that one semiconductor chip is housed in each of said openings; and
fixing said semiconductor chips onto said substrate,
wherein said jig is removed from said substrate after the mounting of said semiconductor devices.

10. A method of manufacturing an electronic device, comprising the steps of:
providing a semiconductor substrate including a plurality of semiconductor devices each having an antenna, and a thickness equal to or less than 30 micrometers;
providing photosensitive material to the part corresponding to said semiconductor devices on the backside of said semiconductor substrate to form a support member of said semiconductor devices;
separating said semiconductor devices each having said support member into a plurality of chips;
providing a substrate;
providing a jig having a plurality of openings, each of which opening has a size corresponding to one said semiconductor chip;
placing said jig on said substrate;
supplying a plurality of said semiconductor chips to said jig so that one semiconductor device is housed in each of said openings; and
fixing said semiconductor chips onto said substrate,
wherein said jig is removed from said substrate after the mounting of said semiconductor devices.

11. A method of manufacturing an electronic device, comprising the steps of:
providing a semiconductor substrate having a plurality of semiconductor devices each having an antenna on the surface;
forming a wall pattern of semiconductor on the backside of said semiconductor substrate by thinning a part corresponding to said semiconductor devices to a thickness equal to or less than 30 micrometers, while leaving part corresponding to the separator area of each of said semiconductor devices thicker than the part corresponding to said semiconductor devices; providing a support member of said semiconductor devices on the inside of said wall pattern;
removing said wall pattern to separate said semiconductor devices each having said support member to a plurality of chips;
providing another substrate;
providing a jig having a plurality of openings, each of which opening has a size corresponding to one said semiconductor chip;
placing said jig on said another substrate;
supplying a plurality of said semiconductor chips to said jig so that one semiconductor device is housed in each of said openings;
fixing said semiconductor chips onto said another substrate; and
melting said support member,
wherein said jig is removed from said substrate after the mounting of said semiconductor devices.

12. A method of manufacturing an electronic device, comprising the steps of:
providing a semiconductor substrate including a plurality of semiconductor devices each having an antenna, and a thickness equal to or less than 30 micrometers;
forming a wall pattern consisted of photosensitive resin on the top or the backside of said semiconductor substrate in part corresponding to the separator region of each of said semiconductor devices;
providing a support member of said semiconductor devices inside said wall pattern;
removing said wall pattern to separate said semiconductor devices into a plurality of chips;
providing a substrate;
providing a positioning jig having a plurality of openings, each of which openings has a size corresponding to one of said semiconductor chips;
registering said substrate to said jig so as to place said jig on said substrate;
supplying a plurality of said semiconductor chips to said jig so that one semiconductor device is housed in each of said openings;

fixing said semiconductor chips to said substrate; and melting said support member, wherein said jig is removed from said substrate after the mounting of said semiconductor devices.

13. A method of manufacturing an electronic device, comprising the steps of:

adding support material on the topside or backside of semiconductor chips;

registering with another film base substrate; and processing to melt said support material to flow said support material around said semiconductor chips;

wherein said support material is provided by screen-printing on the chip region on a semiconductor wafer prior to separating the thin chips.

14. A method of manufacturing an electronic device, comprising the steps of:

adding support material to the top or backside surface of semiconductor chips;

providing a film based substrate;

providing a jig having a plurality of openings, each of which opening has a size corresponding to said semiconductor chips;

providing said jig on said film based substrate;

supplying said semiconductor chips to said jig so that one semiconductor device is housed in each of said openings;

registering said semiconductor chips to said film based substrate; and melting said support material by performing an appropriate process to flow said support material around said semiconductor chips.

15. A method of manufacturing an electronic device, comprising the steps of:

processing the backside of a semiconductor wafer so as to leave some backside silicon material corresponding to the chip separating patterns on the top surface; embedding support material; then removing silicon to have a support material on the backside of semiconductor chips;

providing a film based substrate;

providing a jig having a plurality of openings, each of which opening has a size corresponding to said semiconductor chips;

providing said jig on said film-based substrate;

supplying said semiconductor chips to said jig so that one semiconductor device is housed in each of said openings;

registering said semiconductor chips to said film based substrate; and melting said support material by performing an appropriate process to flow said support material around said semiconductor chips.

16. A method of manufacturing an electronic device, comprising the steps of:

applying resist to and processing the topside or backside of a semiconductor wafer so as to leave resist corresponding to the chip separating patterns on the top surface;

embedding support material;

then removing resist to have a support material on the topside or backside of a semiconductor chip;

providing a film based substrate;

providing a jig having a plurality of openings, each of which opening has a size corresponding to said semiconductor chips;

providing said jig on said film-based substrate;

supplying said semiconductor chips to said jig so that one semiconductor device is housed in each of said openings;

registering said semiconductor chips to said film based substrate; and melting said support material by performing an appropriate process to flow said support material around said semiconductor chips.

17. A method of manufacturing an electronic device, comprising the steps of:

adding support material on the topside or backside of semiconductor chips;

providing a film based substrate;

providing a jig having a plurality of openings, each of which opening has a size corresponding to said semiconductor chips;

providing said jig on said film-based substrate;

supplying said semiconductor chips to said jig so that one semiconductor device is housed in each of said openings;

registering said semiconductor chips to said film based substrate; and processing to melt said support material to flow said support material around said semiconductor chips;

wherein a sheet or printing ink for shielding light covers either topside or backside or both sides of said semiconductor chips.

18. A method of manufacturing an electronic device, comprising the steps of:

adding support material on the topside or backside of semiconductor chips;

providing a film based substrate;

providing a jig having a plurality of openings, each of which opening has a size corresponding to said semiconductor chips;

providing said jig on said film-based substrate;

supplying said semiconductor chips to said jig so that one semiconductor device is housed in each of said openings;

registering said semiconductor chips to said film based substrate; and processing to melt said support material to flow said support material around said semiconductor chips;

wherein said film base integrated with said semiconductor chips are wound to a roll, said roll being sliced in a succeeding process step to form a tape of said film base with said semiconductor chips.

19. A method of manufacturing an electronic device, comprising the steps of:

adding support material on the topside or backside of semiconductor chips;

providing a film based substrate;

providing a jig having a plurality of openings, each of which opening has a size corresponding to said semiconductor chips;

providing said jig on said film-based substrate;

supplying said semiconductor chips to said jig so that one semiconductor device is housed in each of said openings;

registering said semiconductor chips to said film based substrate; and processing to melt said support material to flow said support material around said semiconductor chips;

wherein said film base substrate is formed as part of an IC card.

20. A method of manufacturing an electronic device, comprising the steps of:

adding support material on the topside or backside of semiconductor chips;

providing a film based substrate;

providing a jig having a plurality of openings, each of which opening has a size corresponding to said semiconductor chips;

providing said jig on said film-based substrate;

supplying said semiconductor chips to said jig to house said semiconductor chips into a plurality of said openings;

registering said semiconductor chips to said film based substrate; and processing to melt said support material to flow said support material around said semiconductor chips;

wherein said semiconductor chips has an antenna for each chip for transmitting and receiving data as well as for receiving energy.

21. A method of manufacturing an electronic device, comprising the steps of:

adding support material on the topside or backside of semiconductor chips;

providing a film based substrate;

providing a jig having a plurality of openings, each of which opening has a size corresponding to said semiconductor chips;

providing said jig on said film-based substrate;

supplying said semiconductor chips to said jig so that one semiconductor device is housed in each of said openings;

registering said semiconductor chips to said film based substrate; and processing to melt said support material to flow said support material around said semiconductor chips;

wherein said support material is formed by applying photosensitive material on an entire surface of a semiconductor wafer prior to separating the thin chips, by exposing said photosensitive material with a photomask and light beam and by developing.

22. A method of manufacturing an electronic device, comprising the steps of:

adding support material on the topside or backside of semiconductor chips;

providing a film based substrate;

providing a jig having a plurality of openings, each of which opening has a size corresponding to said semiconductor chips;

providing said jig on said film-based substrate;

supplying said semiconductor chips so that one semiconductor device is housed in each of said openings;

registering said semiconductor chips to said film based substrate; and processing to melt said support material to flow said support material around said semiconductor chips;

wherein said support material being served for compensating for curling of said semiconductor chips.

* * * * *